United States Patent
Hamamoto

(10) Patent No.: US 9,252,305 B2
(45) Date of Patent: Feb. 2, 2016

(54) PHOTOVOLTAIC DEVICE, MANUFACTURING METHOD THEREOF, AND PHOTOVOLTAIC MODULE

(75) Inventor: Satoshi Hamamoto, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 288 days.

(21) Appl. No.: 13/979,272

(22) PCT Filed: Mar. 2, 2012

(86) PCT No.: PCT/JP2012/055450
§ 371 (c)(1),
(2), (4) Date: Jul. 11, 2013

(87) PCT Pub. No.: WO2012/118201
PCT Pub. Date: Sep. 7, 2012

(65) Prior Publication Data
US 2013/0291924 A1 Nov. 7, 2013

(30) Foreign Application Priority Data

Mar. 3, 2011 (WO) .................. PCT/JP2011/054959

(51) Int. Cl.
*H01L 31/0224* (2006.01)
*H01L 31/0352* (2006.01)
(Continued)

(52) U.S. Cl.
CPC .... *H01L 31/03529* (2013.01); *H01L 31/02363* (2013.01); *H01L 31/022425* (2013.01); *H01L 31/068* (2013.01); *H01L 31/1804* (2013.01); *Y02E 10/547* (2013.01)

(58) Field of Classification Search
CPC .................. H01L 31/022425; H01L 31/1804; H01L 31/068; H01L 31/02362; H01L 31/03529
USPC ........................................................ 136/256
See application file for complete search history.

(56) References Cited

U.S. PATENT DOCUMENTS

| 6,147,297 A | 11/2000 | Wettling et al. |
| 2005/0109388 A1* | 5/2005 | Murakami et al. ............ 136/255 |

(Continued)

FOREIGN PATENT DOCUMENTS

| DE | 19522539 A1 | 1/1997 |
| DE | 102006057328 A1 | 6/2008 |

(Continued)

OTHER PUBLICATIONS

International Search Report (PCT/ISA/210) issued on Mar. 27, 2012, by the Japanese Patent Office as the International Searching Authority for International Application No. PCT/JP2012/055450.

(Continued)

*Primary Examiner* — Jayne Mershon
(74) *Attorney, Agent, or Firm* — Buchanan Ingersoll & Rooney PC

(57) ABSTRACT

A photovoltaic device includes a silicon substrate of a first conduction type that includes an impurity diffusion layer on one surface side; a light-receiving-surface side electrode that includes a plurality of grid electrodes electrically connected to the impurity diffusion layer; and a back-surface side electrode formed on the other surface side of the silicon substrate wherein the impurity diffusion layer includes a first impurity diffusion layer and a second impurity diffusion layer, and wherein the first impurity diffusion layer is formed so that a direction perpendicular to a longitudinal direction of the grid electrodes is a longitudinal direction thereof, and so that an area ratio of the first impurity diffusion layer to a band region is equal to or lower than 50%.

13 Claims, 11 Drawing Sheets

(51) Int. Cl.
  *H01L 31/0236* (2006.01)
  *H01L 31/068* (2012.01)
  *H01L 31/18* (2006.01)

(56) References Cited

U.S. PATENT DOCUMENTS

| | | | | |
|---|---|---|---|---|
| 2008/0264473 A1* | 10/2008 | Cumpston et al. | ............ | 136/251 |
| 2008/0271777 A1* | 11/2008 | Stoner et al. | ................. | 136/252 |
| 2011/0139226 A1* | 6/2011 | Ha et al. | ........................ | 136/252 |
| 2011/0139236 A1* | 6/2011 | Lee et al. | ...................... | 136/256 |

FOREIGN PATENT DOCUMENTS

| | | |
|---|---|---|
| JP | 11-508088 A | 7/1999 |
| JP | 2005-123447 A | 5/2005 |
| JP | 2010-186900 A | 8/2010 |
| WO | WO 2009/157052 A1 | 12/2009 |

OTHER PUBLICATIONS

Written Opinion (PCT/ISA/237) issued on Mar. 27, 2012, by the Japanese Patent Office as the International Searching Authority for International Application No. PCT/JP2012/055450.

Niinobe et al., "Honeycomb-Structured Multi-Crystalline Silicon Solar Cells with 18.6% Efficiency via Industrially Applicable Laser Process", $23^{rd}$ European Photovoltaic Solar Energy Conference, Sep. 2008, pp. 1824-1828.

Office Action (Notice of Rejection) issued on Mar. 4, 2014, by the Japanese Patent Office in corresponding Japanese Patent Application No. 2013-502429, and an English Translation of the Office Action. (4 pages).

Notification of the First Office Action issued Apr. 20, 2015 by the Chinese Patent Office in corresponding Chinese Application No. 201280007788.8, and an English translation thereof (12 pages).

Office Action issued May 7, 2015 by the German Office Action in corresponding German Application No. 11 2012 001 067.1, and an English translation thereof (18 pages).

* cited by examiner

FIG.5

| $R_1$ | $R_2$ | r [%] $R_{total}$ | | | |
|---|---|---|---|---|---|
| | | 70 | 65 | 55 | 50 |
| 45 | 80 | 18.4 % | 29.7 % | 58.4 % | 77.1 % |
| 45 | 90 | 28.6 % | 38.5 % | 63.6 % | 80.0 % |
| 45 | 100 | 35.1 % | 44.1 % | 66.9 % | 81.8 % |
| 45 | 110 | 39.6 % | 47.9 % | 69.2 % | 83.1 % |
| 45 | 120 | 42.9 % | 50.8 % | 70.9 % | 84.0 % |
| 45 | 130 | 45.4 % | 52.9 % | 72.2 % | 84.7 % |
| 45 | 140 | 47.4 % | 54.7 % | 73.2 % | 85.3 % |
| 45 | 150 | 49.0 % | 56.0 % | 74.0 % | 85.7 % |
| 40 | 80 | 14.3 % | 23.1 % | 45.5 % | 60.0 % |
| 40 | 90 | 22.9 % | 30.8 % | 50.9 % | 64.0 % |
| 40 | 100 | 28.6 % | 35.9 % | 54.5 % | 66.7 % |
| 40 | 110 | 32.7 % | 39.6 % | 57.1 % | 68.6 % |
| 40 | 120 | 35.7 % | 42.3 % | 59.1 % | 70.0 % |
| 40 | 130 | 38.1 % | 44.4 % | 60.6 % | 71.1 % |
| 40 | 140 | 40.0 % | 46.2 % | 61.8 % | 72.0 % |
| 40 | 150 | 41.6 % | 47.6 % | 62.8 % | 72.7 % |
| 35 | 80 | 11.1 % | 17.9 % | 35.4 % | 46.7 % |
| 35 | 90 | 18.2 % | 24.5 % | 40.5 % | 50.9 % |
| 35 | 100 | 23.1 % | 29.0 % | 44.1 % | 53.8 % |
| 35 | 110 | 26.7 % | 32.3 % | 46.7 % | 56.0 % |
| 35 | 120 | 29.4 % | 34.8 % | 48.7 % | 57.6 % |
| 35 | 130 | 31.6 % | 36.8 % | 50.2 % | 58.9 % |
| 35 | 140 | 33.3 % | 38.5 % | 51.5 % | 60.0 % |
| 35 | 150 | 34.8 % | 39.8 % | 52.6 % | 60.9 % |
| 30 | 80 | 8.6 % | 13.8 % | 27.3 % | 36.0 % |
| 30 | 90 | 14.3 % | 19.2 % | 31.8 % | 40.0 % |
| 30 | 100 | 18.4 % | 23.1 % | 35.1 % | 42.9 % |
| 30 | 110 | 21.4 % | 26.0 % | 37.5 % | 45.0 % |
| 30 | 120 | 23.8 % | 28.2 % | 39.4 % | 46.7 % |
| 30 | 130 | 25.7 % | 30.0 % | 40.9 % | 48.0 % |
| 30 | 140 | 27.3 % | 31.5 % | 42.1 % | 49.1 % |
| 30 | 150 | 28.6 % | 32.7 % | 43.2 % | 50.0 % |
| 25 | 80 | 6.5 % | 10.5 % | 20.7 % | 27.3 % |
| 25 | 90 | 11.0 % | 14.8 % | 24.5 % | 30.8 % |
| 25 | 100 | 14.3 % | 17.9 % | 27.3 % | 33.3 % |
| 25 | 110 | 16.8 % | 20.4 % | 29.4 % | 35.3 % |
| 25 | 120 | 18.8 % | 22.3 % | 31.1 % | 36.8 % |
| 25 | 130 | 20.4 % | 23.8 % | 32.5 % | 38.1 % |
| 25 | 140 | 21.7 % | 25.1 % | 33.6 % | 39.1 % |
| 25 | 150 | 22.9 % | 26.2 % | 34.5 % | 40.0 % |
| 20 | 80 | 4.8 % | 7.7 % | 15.2 % | 20.0 % |
| 20 | 90 | 8.2 % | 11.0 % | 18.2 % | 22.9 % |
| 20 | 100 | 10.7 % | 13.5 % | 20.5 % | 25.0 % |
| 20 | 110 | 12.7 % | 15.4 % | 22.2 % | 26.7 % |
| 20 | 120 | 14.3 % | 16.9 % | 23.6 % | 28.0 % |
| 20 | 130 | 15.6 % | 18.2 % | 24.8 % | 29.1 % |
| 20 | 140 | 16.7 % | 19.2 % | 25.8 % | 30.0 % |
| 20 | 150 | 17.6 % | 20.1 % | 26.6 % | 30.8 % |
| 15 | 80 | 3.3 % | 5.3 % | 10.5 % | 13.8 % |
| 15 | 90 | 5.7 % | 7.7 % | 12.7 % | 16.0 % |
| 15 | 100 | 7.6 % | 9.5 % | 14.4 % | 17.6 % |
| 15 | 110 | 9.0 % | 10.9 % | 15.8 % | 18.9 % |
| 15 | 120 | 10.2 % | 12.1 % | 16.9 % | 20.0 % |
| 15 | 130 | 11.2 % | 13.0 % | 17.8 % | 20.9 % |
| 15 | 140 | 12.0 % | 13.8 % | 18.5 % | 21.6 % |
| 15 | 150 | 12.7 % | 14.5 % | 19.2 % | 22.2 % |

| N | AREA RATIO | | |
|---|---|---|---|
| | RECTANGLE | ELLIPSE | DIAMOND |
| 1 | 1.0 % | 0.8 % | 0.5 % |
| 2 | 2.0 % | 1.6 % | 1.0 % |
| 3 | 3.0 % | 2.4 % | 1.5 % |
| 4 | 4.0 % | 3.1 % | 2.0 % |
| 5 | 5.0 % | 3.9 % | 2.5 % |
| 6 | 6.0 % | 4.7 % | 3.0 % |
| 7 | 7.0 % | 5.5 % | 3.5 % |
| 8 | 8.0 % | 6.3 % | 4.0 % |
| 9 | 9.0 % | 7.1 % | 4.5 % |
| 10 | 10.0 % | 7.9 % | 5.0 % |

FIG.10

(VOLTAGE)

(a)

| AREA RATIO A | AREA RATIO B | CALCULATED VALUE |
|---|---|---|
| 20 % | 100 % | 99.0 % |
| 10 % | 50 % | 99.5 % |
| 5 % | 25 % | 99.8 % |
| 2.5 % | 13 % | 99.9 % |

(CURRENT)

(b)

| AREA RATIO A | AREA RATIO B | CALCULATED VALUE |
|---|---|---|
| 20 % | 100 % | 99.1 % |
| 10 % | 50 % | 99.6 % |
| 5 % | 25 % | 99.8 % |
| 2.5 % | 13 % | 99.9 % |

PHOTOVOLTAIC DEVICE, MANUFACTURING METHOD THEREOF, AND PHOTOVOLTAIC MODULE

FIELD

The present invention relates to a photovoltaic device, a manufacturing method thereof, and a photovoltaic module.

BACKGROUND

For the purpose of improving the performance of a photovoltaic device such as a solar battery, it is important to ensure the following three features, which are to efficiently introduce sunlight into a device, to convert introduced optical energy into electric energy by high current-voltage characteristics, and to efficiently draw converted optical energy to outside. It is also important to ensure long-term reliability that the photovoltaic device can keep outputting power for a long time in a case of additionally considering the practical use of the device.

Generally, to produce the photovoltaic device, an impurity diffusion layer (hereinafter, "diffusion layer") is formed on the surface of a substrate by diffusing impurity opposite in conduction type to the substrate and a PN junction is formed.

The photovoltaic power of the photovoltaic device largely depends on the difference in level between conduction types. Accordingly, from the viewpoint of the photovoltaic power, an impurity concentration (a dopant concentration) that determines a conduction level is preferably high. In addition thereto, the diffusion layer functions as a part of electrodes for efficiently drawing a generated current to an external circuit. From this viewpoint, the dopant concentration is preferably high.

Furthermore, a resistance component gradually increases in a portion in which the electrodes are connected to the PN junction as the photovoltaic device is used for a long time. Accordingly, in the case of additionally considering the long-term reliability, the dopant concentration is preferably high with a view of suppressing the influence of such an increase in the resistance component.

Meanwhile, silicon semiconductor indicates a higher crystal quality as the impurity concentration present inside the silicon semiconductor is lower. When the dopant concentration is too high, the crystal quality as the semiconductor greatly degrades and a recombination rate accelerates, resulting in the reduction in the photovoltaic power. Therefore, when the PN junction is a single junction structure, it is important to set the dopant concentration to an appropriate value while keeping the balance from the three viewpoints mentioned above.

Furthermore, there is a "selective emitter" as one of effective and practical methods for the above objects although its PN junction structure is not a single junction structure. This is a method for changing concentration settings of the diffusion layer depending on structural features. As the most typical example, there is known a two-stage structure, that is, a region near a portion just under each electrode is set as a heavily doped region where the dopant concentration is high and the other region is set as a lightly doped region where the dopant concentration is low (see, for example, Patent Literatures 1 and 2).

In the above example, the heavily doped region near the portion just under each electrode is responsible for a function as a part of the electrode, and the other lightly doped region is responsible for a function of suppressing the degradation in the crystal quality as the semiconductor. That is, it is intended to improve the current-voltage characteristics of a solar battery cell by assigning expected roles mainly to the respective regions.

CITATION LIST

Patent Literatures

Patent Literature 1: Japanese Patent Application Laid-open No. 2010-186900
Patent Literature 2: International Publication Pamphlet No. WO 2009/157052
Patent Literature 3: Japanese Patent Application National Publication No. 11-508088
Patent Literature 4: Japanese Patent Application Laid-open No. 2005-123447

SUMMARY

Technical Problem

However, in this case, it is disadvantageously necessary to make alignment and new secondary restrictions are generated for satisfying alignment conditions because the heavily doped region and the lightly doped region are characterized by regional features that the region near the portion just under each electrode is distinguished from the other region.

In a case of the selective emitter mentioned above, for example, it is considerably difficult or effectively impossible to make each heavily doped region completely match an electrode structure in good proportion. Therefore, in many cases, the heavily doped region is set slightly wider so that a positioning margin can be used at the time of forming each electrode. As a result, a problem occurs that unnecessary heavily doped region remains and the characteristics do not improve as expected. Considering the long-term reliability in addition to the preceding viewpoints, the problem further worsens that the characteristics do not improve as expected because it is desired to set the concentration of the heavily doped region in direct contact with each electrode to be higher.

On the other hand, even when the alignment margin is set as described above in an electrode forming process, high accuracy is required as compared with a single PN junction structure. This leads to a problem of an increase in the manufacturing cost and in fraction defective.

Furthermore, attempts have been made to form each heavily doped region into an independent shape without any correlation to a pattern of light-receiving-surface side electrodes (see, for example, Patent Literatures 3 and 4). However, these attempts are accompanied by using a working process for distinguishing the heavily doped region from the lightly doped region and, at the same time, by making the process also function as a process of forming irregularities on the surface. As a result, there is a problem that it is not possible to ignore restrictions to the heavily doped region that remains and to sufficiently contribute to the improvement in efficiency.

The present invention has been achieved to solve the above problems, and an object of the present invention is to provide a photovoltaic device that is excellent in its photoelectric conversion efficiency and reliability and that is inexpensive.

Solution to Problem

The present invention is directed to a photovoltaic device that achieves the object. The photovoltaic device includes a silicon substrate of a first conduction type that includes an impurity diffusion layer on one surface side, the impurity diffusion layer having an impurity element of a second conduction type diffused therein; a light-receiving-surface side electrode that includes a plurality of grid electrodes electrically connected to the impurity diffusion layer and arranged parallel at a certain interval on the one surface side of the silicon substrate; and a back-surface side electrode formed on the other surface side of the silicon substrate. The impurity diffusion layer includes a first impurity diffusion layer containing the impurity element at a first concentration and a second impurity diffusion layer containing the impurity element at a second concentration lower than the first concentration. The first impurity diffusion layer is formed so that a direction perpendicular to a longitudinal direction of the grid electrodes in the light-receiving-surface side electrode on the one surface side of the silicon substrate is a longitudinal direction thereof, and so that an area ratio of the first impurity diffusion layer to a band region is equal to or lower than 50%. A width of the band region is uniform and identical to a maximum width of the first impurity diffusion layer in a direction parallel to the longitudinal direction of the grid electrodes. A length of the band region in a longitudinal direction is identical to a length of the first impurity diffusion layer in the longitudinal direction of the first impurity diffusion layer.

Advantageous Effects of Invention

According to the present invention, restrictions during manufacturing are relaxed and a lower cost can be realized because a pattern of a first impurity diffusion layer is formed into an independent shape without any correlating to a pattern of light-receiving-surface side electrodes. Furthermore, by additionally considering a practical aspect such as a conventional alignment margin, it is possible to form the first impurity diffusion layer having a lower area ratio than a case of forming the pattern of the first impurity diffusion layer to depend on the pattern of the light-receiving-surface side electrodes. Furthermore, by forming the first impurity diffusion layer so that the area ratio of the first impurity diffusion layer is equal to or lower than 50% a band-shaped region having the same width as the maximum width of the pattern of the first impurity diffusion layer, a flow of a generated current from a second impurity diffusion layer to the first impurity diffusion layer and to grid electrodes can be effectively controlled with the low area ratio. Therefore, it is possible to obtain a photovoltaic device having higher photoelectric conversion efficiency.

BRIEF DESCRIPTION OF DRAWINGS

FIG. 1-2 is a cross-sectional view of an example of the manufacturing method of the photovoltaic device according to the embodiment of the present invention.

FIG. 1-3 is a cross-sectional view of an example of the manufacturing method of the photovoltaic device according to the embodiment of the present invention.

FIG. 1-4 is a cross-sectional view of an example of the manufacturing method of the photovoltaic device according to the embodiment of the present invention.

FIG. 1-5 is a cross-sectional view of an example of the manufacturing method of the photovoltaic device according to the embodiment of the present invention.

FIG. 1-6 is a cross-sectional view of an example of the manufacturing method of the photovoltaic device according to the embodiment of the present invention.

FIG. 1-7 is a cross-sectional view of an example of the manufacturing method of the photovoltaic device according to the embodiment of the present invention.

FIG. 1-8 is a cross-sectional view of an example of the manufacturing method of the photovoltaic device according to the embodiment of the present invention.

FIG. 1-9 is a cross-sectional view of an example of the manufacturing method of the photovoltaic device according to the embodiment of the present invention.

FIG. 1-10 is a cross-sectional view of an example of the manufacturing method of the photovoltaic device according to the embodiment of the present invention.

FIG. 2-1 is a perspective view of an example of the manufacturing method of the photovoltaic device according to the embodiment of the present invention.

FIG. 2-2 is a perspective view of an example of the manufacturing method of the photovoltaic device according to the embodiment of the present invention.

FIG. 2-3 is a perspective view of an example of the manufacturing method of the photovoltaic device according to the embodiment of the present invention.

FIG. 2-4 is a perspective view of an example of the manufacturing method of the photovoltaic device according to the embodiment of the present invention.

FIG. 2-5 is a perspective view of an example of the manufacturing method of the photovoltaic device according to the embodiment of the present invention.

FIG. 2-6 is a perspective view of an example of the manufacturing method of the photovoltaic device according to the embodiment of the present invention.

FIG. 2-7 is a perspective view of an example of the manufacturing method of the photovoltaic device according to the embodiment of the present invention.

FIG. 2-8 is a perspective view of an example of the manufacturing method of the photovoltaic device according to the embodiment of the present invention.

FIG. 2-9 is a perspective view of an example of the manufacturing method of the photovoltaic device according to the embodiment of the present invention.

FIG. 2-10 is a perspective view of an example of the manufacturing method of the photovoltaic device according to the embodiment of the present invention.

FIG. 3 is a characteristic diagram of fill factors (initial values) right after producing photovoltaic devices of samples 1 and those of samples 2.

FIG. 4 depicts a result of a reliability test conducted on photovoltaic devices of the samples 1 and the samples 2, and is a characteristic diagram of a relation between an elapsed time and a degradation rate of fill factors.

FIG. 5 depicts area ratios of a heavily doped n-type diffusion layer to total sheet resistance values in cases of typical combinations of sheet resistance values of the heavily doped n-type diffusion layer and sheet resistance values of a lightly doped n-type diffusion layer, respectively.

FIG. 6 is a characteristic diagram of sheet resistance dependencies of an open voltage and a short-circuit current of a silicon solar battery obtained by simulations.

FIG. 7 are plan views schematically depicting examples of a pattern of the heavily doped n-type diffusion layer according to the embodiment of the present invention.

FIG. 8 depicts area ratios of shapes arranged on a simple lattice depending on short-side and long-side lengths, respectively.

FIG. 9 are plan views schematically depicting examples of a pattern of the heavily doped n-type diffusion layer according to the embodiment of the present invention.

FIG. 10 depict transitions of a voltage and a current with respect to an area ratio of a heavily doped n-type diffusion layer to an entire n-type diffusion layer in a case where "the sheet resistance of the heavily doped n-type diffusion layer is 20Ω/☐ and that of the lightly doped n-type diffusion layer is 90Ω/☐" in the simulations shown in FIG. 6.

DESCRIPTION OF EMBODIMENTS

Figure 1:
FIG. 1-1 is a cross-sectional view of an example of a manufacturing method of a photovoltaic device according to an embodiment of the present invention.

Exemplary embodiments of a photovoltaic device, a manufacturing method thereof, and a photovoltaic module according to the present invention will be explained below in detail with reference to the accompanying drawings. The present invention is not limited to the following descriptions and can be modified as appropriate without departing from the scope of the invention. In addition, in the drawings explained below, for easier understanding, scales of respective members may be different from those of actual products. The same holds true for relationships between the drawings.

Embodiment

An embodiment of the present invention is explained along manufacturing processes with reference to FIGS. 1-1 to 1-10 and 2-1 to 2-10. FIGS. 1-1 to 1-10 are cross-sectional views of an example of a manufacturing method of a photovoltaic device according to the embodiment of the present invention. FIGS. 2-1 to 2-10 are perspective views of an example of the manufacturing method of the photovoltaic device according to the embodiment of the present invention. Processes shown in FIGS. 2-1 to 2-10 correspond to those shown in FIGS. 1-1 to 1-10, respectively.

Figures 1, 2:
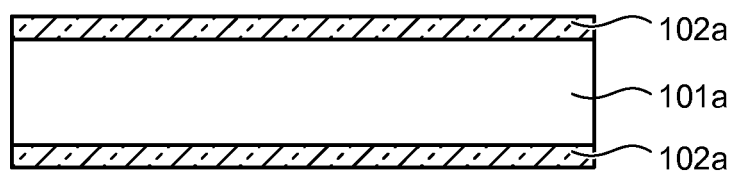

First, for example, a p-type polycrystalline silicon substrate (hereinafter, "p-type silicon substrate 101*a*") that is most commonly used for commercial solar batteries is prepared (FIGS. 1-1 and 2-1).

The p-type silicon substrate 101*a* is manufactured by cutting or slicing a monocrystalline silicon ingot or polycrystalline silicon ingot formed by cooling and solidifying molten silicon to wafers that are formed into silicon substrates each at a desired size and a desired thickness by a band saw or a wire saw such as a multi-wire saw. Therefore, damages generated during slicing remain on a surface of the p-type silicon substrate 101*a*. Therefore, first, with views of removing this damaged layer, the p-type silicon substrate 101*a* is immersed in an acid solution or a heated alkaline solution—for example, an aqueous sodium hydroxide and the surface of the p-type silicon substrate 101*a* is etched, thereby removing damage regions generated at the time of obtaining silicon substrates by slicing and present near the surface of the p-type silicon substrate 101*a*. The p-type silicon substrate 101*a* after removing the damages has a thickness of 200 micrometers, for example, and a size of 150 mm×150 mm, for example.

Alternatively, simultaneously with or subsequent to removal of the damages, microscopic irregularities can be formed as a texture structure on a light-receiving-surface side surface of the p-type silicon substrate 101*a*. By forming such a texture structure on the light-receiving surface side of a semiconductor substrate, it is possible to cause multiple reflection of light on a surface of the photovoltaic device, to efficiently absorb the light incident on the photovoltaic device into a silicon substrate, to effectively reduce reflectivity, and to improve conversion efficiency.

The formation method and the shape of the texture structure are not limited to any specific one because the present invention relates to a structure of a diffusion layer of the photovoltaic device. For example, a method using an alkaline aqueous solution containing isopropyl alcohol or acid etching by a mixture solution mainly containing hydrofluoric acid and nitric acid, a method of obtaining a honeycomb structure or an inverse-pyramid structure on the surface of the p-type silicon substrate 101*a* by forming a mask material in which openings are partially provided on the surface of the p-type silicon substrate 101*a* and etching the surface thereof via the mask material, or a method using reactive gas etching (RIE: Reactive Ion Etching) can be adopted. In this way, any arbitrary method can be used.

Next, this p-type silicon substrate 101*a* is put into a thermal diffusion furnace and heated in an atmosphere of phosphorus (P) that is an n-type impurity. Through this process, high-concentration phosphorus (P) is diffused on each surface of the p-type silicon substrate 101*a*, a heavily doped n-type impurity diffusion layer (hereinafter, "heavily doped n-type diffusion layer") 102*a* is formed as a first impurity diffusion layer containing the phosphorus at a first concentration, and a semiconductor pn junction is formed (FIGS. 1-2 and 2-2). In the present embodiment, the heavily doped n-type diffusion layer 102*a* is formed by heating the p-type silicon substrate 101*a* at a temperature of, for example, 850° C. to 900° C. in an atmosphere of phosphorus oxide chloride ($POCl_3$) gas. At this time, a heat treatment is controlled so that a surface sheet resistance of the heavily doped n-type diffusion layer 102*a* is, for example, 15Ω/☐ to 45Ω/☐, preferably 25Ω/☐ to 35Ω/☐. Because a diffusion layer formed by thermal diffusion has a complicated concentration distribution curve, a stereotypical expression such as "concentration×depth" is virtually meaningless and a sheet resistance is often used as an expression making up for the former expression.

Figures 1, 2, 3:
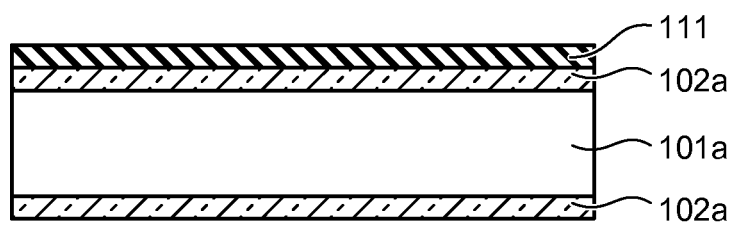

Next, a film having an etching resistance property (hereinafter, "etching resistance film") 111 is formed on the heavily doped n-type diffusion layer 102*a* (FIGS. 1-3 and 2-3). For example, as the etching resistance film 111, a silicon nitride film (hereinafter, "SiN film") having a thickness of 80 nanometers is formed by a plasma CVD (Chemical Vapor Deposition) method. While the SiN film is used in the present embodiment, a silicon oxide film ($SiO_2$ or SiO), a silicon oxynitride film (SiON), an amorphous silicon film (a-Si), a diamond-like carbon film, a resin film or the like can be used as the etching resistance film 111. While the thickness of the etching resistance film 111 is set to 80 nanometers in the present embodiment, an appropriate thickness can be selected based on texture, etching conditions during etching, and an SiN-film removal performance in a subsequent process.

Next, a laser beam is irradiated onto the etching resistance film 111, thereby forming microscopic openings 112 (FIGS. 1-4 and 2-4). The openings 112 are formed in texture-structure forming regions 113*a*. The openings 112 are not formed in regions 113*b* where the texture structure is not to be formed but the heavily doped n-type diffusion layer 102*a* remains. Alternatively, the openings 112 can be formed using processing means other than laser-beam irradiation. Specific examples of such processing means include a photoengraving process and blast processing used in semiconductor processing.

Next, the p-type silicon substrate 101*a* is wet-etched through the openings 112 (FIGS. 1-5 and 2-5). Because the p-type silicon substrate 101*a* is etched through the microscopic openings 112, concave portions 114 are formed at concentric positions to the microscopic openings 112 on one of the surfaces of the p-type silicon substrate 101*a*. A mixture solution of the hydrofluoric acid and the nitric acid, for example, is used as an etchant. The hydrofluoric acid and the nitric acid are mixed together by a mixture ratio as represented by a volume ratio of "hydrofluoric acid:nitric acid: water=1:20:10". The mixture ratio of the mixture solution can be changed to an appropriate value depending on a desired etching rate and a desired etching shape. With the etching using the mixed acid etchant, the etching is performed without the influence of a crystal face orientation of the surface of the silicon substrate. Therefore, the texture of the same shape can be formed uniformly and the photovoltaic device having a smaller surface reflection loss can be formed.

More preferably, an aqueous solution containing alkaline metal hydroxide such as sodium hydroxide or potassium hydroxide is used only when the p-type silicon substrate 101a is made of monocrystalline silicon and a slice plane is (100) plane. It is advantageous to perform etching without the influence of the crystal face orientation as described above in a case where the p-type silicon substrate 101a is made of monocrystalline silicon or polycrystalline silicon and the slice plane is other than the (100) plane. Conversely, however, as for the etching of the monocrystalline silicon having the (100) plane, it is preferable to use the aqueous solution containing alkaline metal hydroxide because it is relatively easy to process the p-type silicon substrate 101a into a shape that can further reduce the reflectivity using the etchant for anisotropy.

In this case, each of the concave portions 114 has an inverse-pyramid shape. Specific examples of the etchant include an etchant obtained by heating 0.5 wt % to 4 wt % of a sodium hydroxide solution at 70° C. to 95° C. and an etchant obtained by adding a surface-active agent to such an aqueous solution.

To follow the formation of the concave portions 114, the heavily doped n-type diffusion layer 102 present in the concave portions 114 is simultaneously removed. In the regions 113b where the heavily doped n-type diffusion layer 102a remains, the heavily doped n-type diffusion layer 102a remains as intended. Selection of a pattern (shape and size) of each region 113b where the heavily doped n-type diffusion layer 102a remains includes most important elements of the present invention. This selection is described later in detail.

After forming the concave portions 114, the etching resistance film 111 is removed using the hydrofluoric acid (FIGS. 1-6 and 2-6).

Next, this p-type silicon substrate 101a is put into the thermal diffusion furnace again and heated in the atmosphere of phosphorus (P) that is the n-type impurity. Through this process, low-concentration phosphorus (P) is diffused on one of the surfaces of the p-type silicon substrate 101a, a lightly doped n-type impurity diffusion layer (hereinafter, "lightly doped n-type diffusion layer") 102b is formed as a second impurity diffusion layer containing the phosphorus having a second concentration, and a semiconductor pn junction is formed (FIGS. 1-7 and 2-7). The second concentration is lower than the first concentration. The n-type impurity diffusion layer (hereinafter, "n-type diffusion layer") 102 constituted by the heavily doped n-type diffusion layer 102a and the lightly doped n-type diffusion layer 102b is thereby formed. In the present embodiment, the heavily doped n-type diffusion layer 102a is formed by heating the p-type silicon substrate 101a at a temperature of, for example, about 840° C. in the atmosphere of the phosphorus oxide chloride (POCl$_3$) gas. At this time, a heat treatment is controlled so that a surface sheet resistance of the lightly doped n-type diffusion layer 102b is 60Ω/□ to 150Ω/□, for example. Because the diffusion layer formed by the thermal diffusion has a complicated concentration distribution curve, the stereotypical expression such as "concentration×depth" is virtually meaningless and the sheet resistance is often used as the expression making up for the former expression.

In the regions 113b where the heavily doped n-type diffusion layer 102a remains, the heavily doped n-type diffusion layer 102a is not removed but remains during the etching. Therefore, even when the low-concentration phosphorus (P) is diffused on the regions 113b, the heavily doped n-type diffusion layer 102a remains almost as it stands. Furthermore, in the texture-structure forming regions 113a, the heavily doped n-type diffusion layer 102a present in the openings 112 is removed during the etching. Therefore, the lightly doped n-type diffusion layer 102b is formed on an inner surface of each opening 112.

A method of forming a series of the heavily doped n-type diffusion layer 102a and the lightly doped n-type impurity diffusion layer 102b except for the selection of formation patterns (shape and size) has no direct relevance to essential characteristic parts of the present embodiment. Therefore, this method is not limited to any specific one. Examples of cases other than the means described above shown in the present embodiment include a method of selectively forming the heavily doped n-type diffusion layer only in desired regions by locally irradiating a laser beam, applying heat, and further accelerating diffusion after temporarily forming the lightly doped n-type diffusion layer, a method of selectively diffusing the high-concentration phosphorus (P) via exposed portions of the openings in the etching resistance film oppositely to the case described in the present embodiment, and a method of selectively forming each region of the heavily doped n-type diffusion layer and each region of the lightly doped n-type diffusion layer by partially applying diffusion pastes on the silicon substrate.

After forming both the heavily doped and lightly doped diffusion layers, a phosphorus glass layer mainly containing phosphorus oxide is formed on the surface on which the lightly doped n-type impurity diffusion layer 102b is formed. Accordingly, the phosphorus glass is removed using a hydrofluoric acid solution or the like.

Next, a silicon nitride film (SiN film) is formed as an anti-reflection film 103 on a light-receiving-surface side of the p-type silicon substrate 101a on which the heavily doped n-type diffusion layer 102a and the lightly doped n-type impurity diffusion layer 102b are formed so as to improve photoelectric conversion efficiency (FIGS. 1-8 and 2-8). For example, the plasma CVD method is used to form the anti-reflection film 103, and the silicon nitride film is formed as the anti-reflection film 103 using mixture gas of silane and ammonium. A thickness and a refraction index of the anti-reflection film 103 are set to values at which the anti-reflection film 103 can suppress light reflection most. As the anti-reflection film 103, a film of two or more stacked layers having different refraction indexes can be used. To form the anti-reflection film 103, another film formation method such as a sputtering method can be used. In another alternative, a silicon oxide film can be formed as the anti-reflection film 103.

Next, the heavily doped n-type diffusion layer 102a formed on the back surface of the p-type silicon substrate 101a by the diffusion of phosphorus (P) is removed (FIGS. 1-9 and 2-9). As a result, a semiconductor substrate 101 in which the p-type silicon substrate 101a serving as a first conductive layer and the n-type diffusion layer 102 formed on the light-receiving-surface side of the p-type silicon substrate 101a and serving as a second conductive layer constitute a pn junction is obtained.

The heavily doped n-type diffusion layer 102a formed on the back surface of the p-type silicon substrate 101a is removed using a single side etching device, for example. Alternatively, a removal method including immersing the entire p-type silicon substrate 101a in an etchant with the anti-reflection film 103 used as a mask can be adopted. As the etchant, an etchant obtained by heating the alkaline aqueous solution such as the sodium hydroxide solution or a potassium hydroxide solution at a room temperature to 95° C., preferably 50° C. to 70° C. is used. Alternatively, a mixture aqueous solution of nitric acid and hydrofluoric acid can be used as the etchant.

Finally, light-receiving-surface side electrodes and a back-surface side electrode are formed. First, an aluminum-mixed electrode material paste for formation of the back-surface side electrode is applied onto the entire back surface of the semiconductor substrate 101 by screen printing, and the paste is then dried. Next, a silver-mixed electrode material paste for formation of the light-receiving-surface side electrodes is applied onto the anti-reflection film 103 that is a light-receiving surface of the semiconductor substrate 101 into a comb shape by the screen printing, and the paste is then dried. The electrode material paste for the light-receiving-surface side electrodes is applied onto the texture-structure forming regions 113a.

Thereafter, the electrode material pastes on light-receiving surface side and the back surface side of the semiconductor substrate 101 are simultaneously burned in, for example, an atmospheric atmosphere at a temperature of about 760° C., thereby obtaining light-receiving-surface side electrodes 105 and a back-surface side electrode 104 (FIGS. 1-10 and 2-10). At this time, on the light-receiving surface side of the semiconductor substrate 101, a silver material contacts silicon and is re-solidified while the anti-reflection film 103 is molten with glass contained in the paste. As a result, it is possible to ensure good resistive bonding between the n-type diffusion layer 102 and the light-receiving-surface side electrodes 105. The light-receiving-surface side electrodes 105 are formed in the texture-structure forming regions 113a. That is, the light-receiving-surface side electrodes 105 are formed on the lightly doped n-type diffusion layer 102b. As an electrode pattern of the light-receiving-surface side electrodes 105, a comb-shaped configuration is constituted by a plurality of thin and long grid electrodes arranged in parallel in a predetermined direction at a certain interval and a plurality of bus electrodes. The grid electrodes are locally provided on the light-receiving surface so as to collect electric power generated in the semiconductor substrate 101. The bus electrodes are provided to be nearly orthogonal to the grid electrodes so as to draw the electric power collected by the grid electrodes. The grid electrodes and the bus electrodes are electrically connected to the n-type diffusion layer 102 on bottoms thereof.

By performing the above processes, the photovoltaic device according to the present embodiment is manufactured.

Next, the selection of the pattern (shape and size) of the regions 113b where the heavily doped n-type diffusion layer 102a remains is explained. With a structure of a conventional photovoltaic device, the heavily doped n-type diffusion layer basically remains in light-receiving-surface-side-electrode forming regions. The reason is as follows. When the light-receiving-surface side electrodes are formed on the lightly doped n-type diffusion layer, it is conventionally considered that a component of a contact resistance between the light-receiving-surface side electrodes and the diffusion layer and that of a series resistance due to a concentrated current increase and this causes a deterioration in a fill factor and makes the fill factor unstable.

The present inventors actually produced, as prototypes, a plurality of photovoltaic devices as samples 1 each having a conventional configuration in which the light-receiving-surface side electrodes were formed in the regions where the heavily doped n-type diffusion layer remained ("heavily doped n-type diffusion layer regions") and a plurality of photovoltaic devices as samples 2 each having a configuration in which the light-receiving-surface side electrodes were formed to be deviated from the heavily doped n-type diffusion layer regions. The samples 1 and 2 were configured in the same conditions except for different formation positions of the light-receiving-surface side electrodes. Furthermore, an area ratio of the heavily doped n-type diffusion layer regions to the entire light-receiving surface is 20%. The present inventors evaluated characteristics of the photovoltaic devices of the samples 1 and the samples 2.

Figures 1, 2, 3, 4:
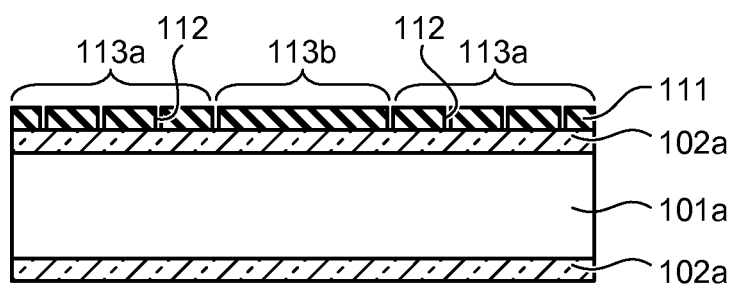

As a result, as shown in FIG. 3, as for the photovoltaic devices of the samples 2, a reduction in the fill factor (FF) supposed by a conventional knowledge is not recognized, and the influence of the formation of the light-receiving surface side electrodes to be deviated from the heavily doped n-type diffusion layer regions is limited to a decrease in current due to an increase in light-receiving regions on the heavily doped n-type diffusion layer. FIG. 3 is a characteristic diagram of fill factors (initial values) right after producing photovoltaic devices of the samples 1 and those of the samples 2. Furthermore, as for the long-term reliability for ensuring that the photovoltaic device can keep outputting power for a long time, a result of a severe degradation was not recognized in the photovoltaic devices of the samples 2 up to elapsed time of 2000 hours, as shown in FIG. 4. FIG. 4 depicts a result of a reliability test conducted on photovoltaic devices of the samples 1 and the samples 2, and is a characteristic diagram of a relation between an elapsed time and a degradation rate of fill factors (FF). The degradation rate of each of the fill factors (FF) shown in FIG. 4 is obtained by dividing the photoelectric conversion efficiency of each photovoltaic device after the reliability test by the photoelectric conversion efficiency of the photovoltaic device before the reliability test.

In this way, when disadvantages of the characteristics supposed by conventional knowledge are not actually present, there is no need to consider the alignment between the heavily doped n-type diffusion layer and the light-receiving-surface side electrodes. When patterns of the heavily doped n-type diffusion layer/lightly doped n-type diffusion layer are considered independently of that of the light-receiving-surface electrodes without designing the patterns of these layers despite the disadvantages such as the alignment margin for the light-receiving-surface electrodes, wider flexibility and greater advantages can be achieved. Particularly, when a region ratio of the heavily doped n-type diffusion layer 102a according to the present invention is set to be lower than that of the heavily doped n-type diffusion layer including the margin according to conventional techniques, it is possible to suppress the adverse effect of the heavily doped n-type diffusion layer on the current, that is, a decrease in the current to be lower than an intended current and possible to improve the characteristics.

As the sheet resistance value of the heavily doped n-type diffusion layer is indicated by $R_1$, the area ratio of the heavily doped n-type diffusion layer to the entire n-type diffusion layer is indicated by r, the sheet resistance value of the lightly doped n-type diffusion layer is indicated by $R_2$, and the area ratio of the lightly doped n-type diffusion layer to the entire n-type diffusion layer is indicated by (1−r), a total sheet resistance value $R_{total}$ of the n-type diffusion layer is expressed by the following equation (1).

$$\frac{1}{R_{total}} = \frac{r}{R_1} + \frac{1-r}{R_2} \qquad (1)$$

Based on the Equation (1), the area ratio r of the heavily doped n-type diffusion layer is expressed by the following equation (2).

$$r = \frac{R_1(R_2 - R_{total})}{R_{total}(R_2 - R_1)} \qquad (2)$$

When the PN junction is a single junction structure, the total sheet resistance value $R_{total}$ of the light-receiving surface is preferably 50Ω/□ to 70Ω/□, more preferably 55Ω/□ to 65Ω/□. Even in a case of a double PN junction structure as shown in the photovoltaic device according to the present embodiment, the total sheet resistance value $R_{total}$ is preferably in the above range. When the value $R_{total}$ is lower than 50Ω/□ (the dopant concentration is too high), then the crystal quality as the semiconductor degrades greatly and a recombination rate accelerates. As a result, the power is not efficiently generated in the silicon and the photovoltaic power falls. When the value $R_{total}$ is higher than 70Ω/□ (the dopant concentration is too low), the power generated in the silicon cannot be efficiently drawn outside. As a result, similarly to the case of the too high sheet resistance, the photovoltaic power falls. In addition, the probability of the degradation in the long-term reliability due to the increase in the resistance component of the portions in which the electrodes are connected to the PN junction rises. Therefore, by setting the total sheet resistance value $R_{total}$ of the light-receiving surface to fall in the range from 55Ω/□ to 65Ω/□, it is possible to keep more satisfactory balance among the crystal quality as the semiconductor, a photovoltaic amount resulting from the level difference between the PN junctions, and the long-term reliability, and possible to obtain better characteristics.

Figures 1, 2, 3, 4, 5:
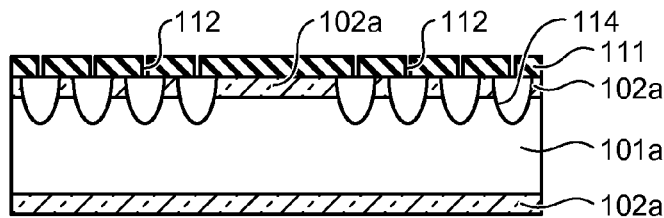

FIG. 5 depicts area ratios r of a heavily doped n-type diffusion layer to the total sheet resistance values $R_{total}$ in cases of typical combinations of sheet resistance values $R_1$ of the heavily doped n-type diffusion layer and sheet resistance values $R_2$ of the lightly doped n-type diffusion layer, respectively. FIG. 5 depicts the area ratios r of the heavily doped n-type diffusion layer to correspond to each of four types of the $R_{total}$: 50Ω/□, 55Ω/□, 65Ω/□, and 70Ω/□. To realize these $R_{total}$, it is preferable to set the area ratio r of the heavily doped n-type diffusion layer to fall in ranges as shown in FIG. 5. By controlling the area ratio r of the heavily doped n-type diffusion layer to fall in such ranges, it is possible to realize the photovoltaic device having a good fill factor (FF).

Furthermore, with respect to comparison with a structure of a conventional photovoltaic device (a structure in which the heavily doped n-type diffusion layer remains basically in the forming regions of the light-receiving-surface side electrodes), the area ratio r of the conventional typical heavily doped n-type diffusion layer is 20%. When the combination of the $R_1$ and the $R_2$ is selected so that the area ratio r of the heavily doped n-type diffusion layer 102a falls below 20%, the adverse effect of the heavily doped n-type diffusion layer on the current, that is, the decrease in the current to be lower than the intended current can be suppressed and the characteristics can improve. From the viewpoint of a characteristic improvement effect, the area ratio r of the heavily doped n-type diffusion layer 102a is more preferably equal to or lower than 10%.

In this case, with views of realizing the structure of the photovoltaic device having the higher photoelectric conversion efficiency, it is important to set a lower area ratio of the heavily doped region and to more efficiently introduce the generated current to the grid electrodes. In the structure in which the heavily doped n-type diffusion layer and the lightly doped n-type diffusion layer are mixed together as shown in the present embodiment, a current component generated particularly in the lightly doped n-type diffusion layer flows first from a generation point to the closest heavily doped n-type diffusion layer at a shortest distance and then reaches the grid electrodes along the shape of the heavily doped n-type diffusion layer. Therefore, a resistance value generated up to the grid electrode at each point correlates to a numerical value represented by "(Sheet resistance of lightly doped n-type diffusion layer)×(Total path length of lightly doped n-type diffusion layer)+(Sheet resistance of heavily doped n-type diffusion layer)×(Total path length of heavily doped n-type diffusion layer)". It is important to set the shape of the heavily doped n-type diffusion layer 102a that can suppress the above numerical value to be small with a lower area ratio. The heavily doped n-type diffusion layer does not necessarily contact the grid electrodes. Even when the heavily doped n-type diffusion layer does not contact the grid electrodes, the logic described above is applicable. In this case, the current component reaches the grid electrodes after passing through respective paths of the heavily doped n-type diffusion layer and the lightly doped n-type diffusion layer so that the sum of the formula mentioned above becomes a minimum value.

Meanwhile, when attention is paid to the pattern of the heavily doped n-type diffusion layer from the viewpoint described above, a shape of the pattern perpendicular to the grid electrodes in the plane of the light-receiving surface of the photovoltaic device has a directionality of allowing the generated current component to be close to the grid electrodes at the shortest distance, and is effective to more efficiently introduce the generated current to the grid electrodes. Conversely, a component in parallel to the grid electrodes does not allow the generated current to be close to the grid electrodes while the generated current passes through the directional component, and lacks effectiveness for more efficiently introducing the generated current to the grid electrodes even in a heavily doped n-type diffusion layer (a low sheet resistance region). When these viewpoints are reflected in a specific shape, it is concluded that a linear pattern formed perpendicularly to the grid electrodes in the plane of the light-receiving surface of the photovoltaic device is appropriate as the shape of the pattern of the heavily doped n-type diffusion layer.

Figures 1, 2, 3, 4, 5, 6:
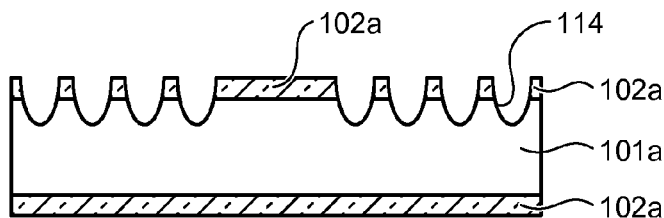

On the other hand, as attention is paid to suppressing the area ratio of the heavily doped n-type diffusion layer, it cannot be said that a simple linear or stripe shape suffices to suppress the area ratio of the heavily doped n-type diffusion layer. FIG. 6 is a characteristic diagram of sheet resistance dependencies (relative values) of an open voltage (Voc) and a short-circuit current (Isc) of a silicon solar battery obtained by simulations in the same conditions except for the total sheet resistance of the n-type diffusion layer on the light-receiving surface. FIG. 6 depicts the sheet resistance dependencies based on a case where the total sheet resistance of the n-type diffusion layer is 90Ω/□ (with this case set to 100%). Needless to mention, the crystal quality as the semiconductor degrades and the recombination rate accelerates as the sheet resistance decreases (the impurity concentration increases). As a result, the photovoltaic power falls and both the Voc and the Isc decrease. The decreases are particularly noticeable in a range equal to or lower than 40Ω/□ which range is effective as that for the heavily doped n-type diffusion layer. When such a structure is adopted, it is necessary to suppress the area ratio of the heavily doped n-type diffusion layer more comprehensively.

However, when the heavily doped n-type diffusion layer has a simple linear or stripe shape, means for suppressing the area ratio is limited to narrowing the width. Furthermore, when inexpensive processing means such as a product made in bulk is supposed to be used, the probability increases that the heavily doped n-type diffusion layer cannot be processed as desired because it is necessary to consider the size accuracy and processing limit, and that the area ratio of the heavily doped n-type diffusion layer cannot be suppressed. Therefore, it is important to further elaborately set the shape so as to be able to effectively suppress the area ratio of the heavily doped n-type diffusion layer at a size at which it is relatively easy to process the heavily doped n-type diffusion layer.

Examples of a method of effectively suppressing the area ratio of the heavily doped n-type diffusion layer using almost the same size include adoption of an intermittent pattern such as a dot pattern as the shape of the heavily doped n-type diffusion layer. For example, a stripe region where stripes each having a width of 0.1 millimeter are arranged at an interval of 1 millimeter is formed so that the area ratio stripe region to a predetermined region becomes 10%. Alternatively, consider a case of forming 1-mm square dots (simple lattice) in the same region as the stripe region in place of the stripe region at an interval of 1 millimeter. While the area ratio of the stripe region to the predetermined region is 10%, the area ratio of the square dot (simple lattice) region to the predetermined region is about 1% and it is possible to reduce the area ratio more conspicuously.

Figures 1, 2, 3, 4, 5, 6, 7:
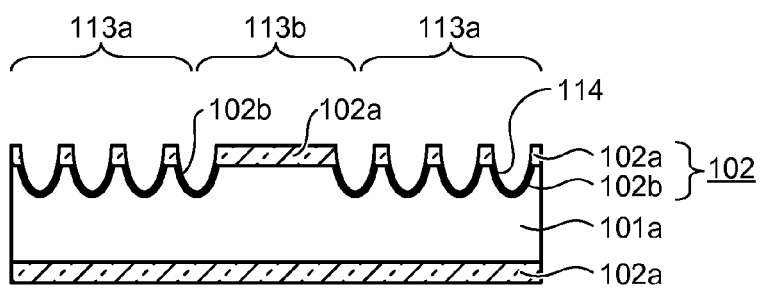

As a result of a combination of the above considerations, the intermittent shape such as a rectangular shape, an elliptic shape, or a diamond shape with a direction perpendicular to a longitudinal direction of the grid electrodes set as a longitudinal direction in the plane of the light-receiving surface of the photovoltaic device is proposed as the shape of the heavily doped n-type diffusion layer that embraces the positive features of the both considerations (FIG. 7). FIG. 7 are plan views schematically depicting examples of a pattern of the heavily doped n-type diffusion layer $102a$ according to the present embodiment. In FIG. 7, FIG. 7($a$) is an example of a rectangular pattern of the heavily doped n-type diffusion layer $102a$, FIG. 7($b$) is an example of an elliptical pattern of the heavily doped n-type diffusion layer $102a$, and FIG. 7($c$) is an example of a diamond pattern of the heavily doped n-type diffusion layer $102a$. In FIG. 7, an arrow X indicates a longitudinal direction (an extending direction) of the grid electrodes and an arrow Y indicates the direction perpendicular to the longitudinal direction of the grid electrodes. Furthermore, in FIG. 7, a dashed line indicates a stripe (band) shape having the same width as a short-side maximum width of the heavily doped n-type diffusion layer $102a$ as a uniform width, and a dashed-dotted line indicates a center line of the stripe (band) shape.

Figures 1, 2, 3, 4, 5, 6, 7, 8:
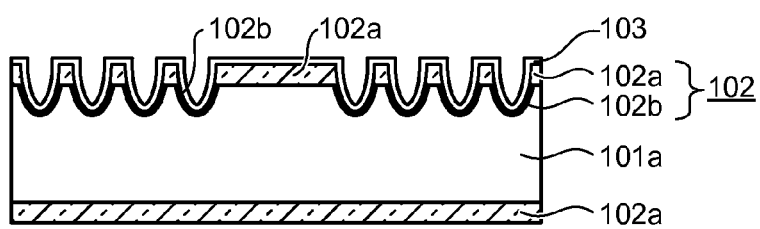

FIG. 8 depicts area ratios of shapes arranged on a simple lattice depending on short-side and long-side lengths, respectively. FIG. 8 depicts the area ratios of the shapes to the lattice region when the rectangular, elliptical, and diamond shapes each having the short-side length of 0.1 millimeter and the long-side length of $0.1 \times N$ mm are arranged on the simple lattice, respectively. A numerical value of N=10 for the rectangle shown in FIG. 8 is the same as that in a case of arranging stripes at the width of 1 millimeter. In all cases shown in FIG. 8 except for the rectangle at N=10, the area ratios can be effectively suppressed as compared with the stripes having the same short-side size. Particularly, the effect of reducing the area ratio is considerable when N≤5.

As a structure appropriate for the object of the present embodiment, any structure is appropriate for the object as long as the area ratio is lower than that of the heavily doped n-type diffusion layer $102a$ of the stripe shape having the same width as the short-side length of the shape. However, as a result of considerations of the present inventors, it was clear that the area ratio of the heavily doped n-type diffusion layer $102a$ of the shape equal to or lower than 50% of that of the heavily doped n-type diffusion layer $102a$ of the stripe (band) shape having the same width as the shorter-side maximum width of each of the above shapes as the uniform width is preferable in view of a considerable effect of reducing the area ratio. It is possible to suppress the decreases in the current and the voltage due to the heavily doped n-type diffusion layer by reducing the area ratio of the heavily doped n-type diffusion layer. In a structure partially including the heavily doped n-type diffusion layer, the current directly gains the decreasing effect and an inverse of the voltage directly gains the decreasing effect almost in proportion to the area ratio of the heavily doped n-type diffusion layer current. In any case, the higher area ratio of the heavily doped n-type diffusion layer has a greater adverse effect on the current and the voltage. Therefore, it is preferable to reduce the area ratio of the heavily doped n-type diffusion layer as much as possible. The length of the stripe (band) shape in the longitudinal direction is assumed to be equal to the entire length of the pattern in which the heavily doped n-type diffusion layer of each of the above shapes is arranged in the longitudinal direction. It is also preferable that a size ratio of the long side to the short side of each of the shapes falls in a range from 1 to 5. When this size ratio is lower than 1, the side is not called the long side and the component in parallel to the longitudinal direction of the grid electrodes increases. Therefore, the shape having such size ratio is not appropriate for the object of the present embodiment. When the size exceeds 5, it cannot be said that the reduction effect of the area ratio is conspicuous although it depends on the shape.

Furthermore, a lower limit value of the area ratio of the heavily doped n-type diffusion layer to the stripe (band) shape having the same width as the short-side maximum width of each of the above shapes as the uniform width can be proposed as follows as an example from the viewpoint of the processing limit although the lower limit value is not limited to any specific one from the viewpoint of functions.

(Example 1 of Lower Limit Value)
At grid electrode interval=1 mm and processing limit to the formation of the pattern of heavily doped n-type diffusion layer=100 μm (0.1 mm):

(0.1 mm×0.1 mm)/(1 mm×1 mm)=0.01(=1%)

(Example 2 of Lower Limit Value)
At grid electrode interval=2 mm and processing limit to the formation of the pattern of heavily doped n-type diffusion layer=100 μm (0.1 mm):

(0.1 mm×0.1 mm)/(2 mm×2 mm)=0.0025(=0.25%)

Figures 1, 2, 3, 4, 5, 6, 7, 8, 9:
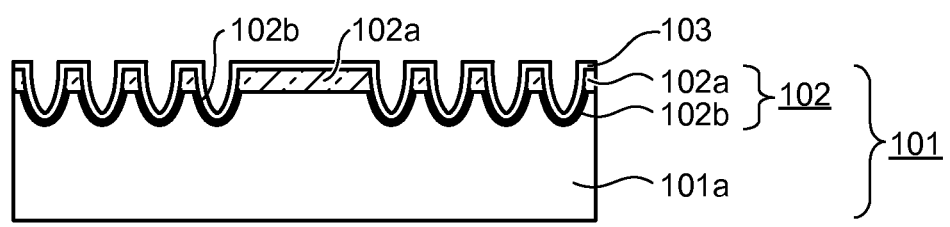

Besides the intermittent shape, a "wavy" shape continuous in the direction perpendicular to the longitudinal direction of the grid electrodes in the plane of the light-receiving surface of the photovoltaic device and having changing widths is proposed as the shape of the heavily doped n-type diffusion layer (FIG. 9). FIG. 9 are plan views schematically depicting examples of the pattern of the heavily doped n-type diffusion layer $102a$ according to the present embodiment. In FIG. 9, FIG. 9($a$) is an example of the pattern of the heavily doped n-type diffusion layer $102a$ in which an almost identical shape continuous in the direction perpendicular to the longitudinal direction of the grid electrodes and having changing widths is repeated almost regularly. FIG. 9(b) is an example of the pattern of the heavily doped n-type diffusion layer 102a in which irregular shapes are continuous in the direction perpendicular to the longitudinal direction of the grid electrodes and have changing widths. In FIG. 9, the arrow X indicates a longitudinal direction (an extending direction) of the grid electrodes and the arrow Y indicates the direction perpendicular to the longitudinal direction (an extending direction) of the grid electrodes. Furthermore, in FIG. 9, the dashed line indicates the stripe (band) shape having the width that is the same width as the short-side maximum width of the heavily doped n-type diffusion layer 102a as the uniform width, and the dashed-dotted line indicates the center line of the stripe (band) shape. In cases of these shapes, similarly to the above cases, it is possible to effectively suppress the area ratio as compared with the stripe shape having the uniform short-side size. In these cases, similarly to the above cases, the area ratio of the heavily doped n-type diffusion layer 102a of this shape is preferably equal to or lower than 50% of that of the stripe (band) shape having the uniform width in view of the considerable effect of reducing the area ratio.

As for an intersectional relation between the arrangement of the heavily doped n-type diffusion layer of each shape described above and the grid electrodes, the expression "perpendicular" is simply used because of the easiness to understand. Although it is certain that "completely perpendicular" is ideal, it is actually reasonable to permit a certain range. When an error angle (a gap angle) between a line in parallel to the direction (the extending direction) along the arrangement of the heavily doped n-type diffusion layer of each shape and a segment (a direction) truly perpendicular to the grid electrodes is expressed by θ, the error angle θ according to the idea of keeping giving a higher priority to the component of the heavily doped n-type diffusion layer perpendicular to the longitudinal direction of the grid electrodes than the parallel component is appropriate for the object of the present invention similarly to the above cases. That is, when the component perpendicular to the longitudinal direction of the gird electrodes is assumed as the longitudinal component of the heavily doped n-type diffusion layer, the error angle θ in the following range is appropriate for the object of the present embodiment.

(1) When the Heavily Doped n-Type Diffusion Layer has the Continuous Shape:

Absolute value of tangent(tan θ)≤(Maximum width of heavily doped n-type diffusion layer)/(Grid electrode interval×½)

(2) When the Heavily Doped n-Type Diffusion Layer has the Intermittent Shape:

Absolute value of tangent(tan θ)≤(Short-side size of heavily doped n-type diffusion layer)/(Long-side size of heavily doped n-type diffusion layer).

The maximum width of the heavily doped n-type diffusion layer is equal to the maximum width in the longitudinal direction. The maximum width corresponds to a width between the dashed lines in the X direction in the examples of FIGS. 7 and 9. Furthermore, in the case where the heavily doped n-type diffusion layer has the continuous shape, an intermediate position between the grid electrodes is the farthest to the grid electrodes in the direction perpendicular to the grid electrodes in the regions of the n-type diffusion layer. Therefore, it is appropriate to consider the relation based on this position when the heavily doped n-type diffusion layer has the continuous shape.

Whether the shape of the heavily doped n-type diffusion layer is continuous or intermittent, detailed positions are not limited to any specific one. Nevertheless, it is preferable that the detailed shapes have repeatability from the viewpoints of the manufacturing easiness and a cost reduction. Furthermore, to expect uniformity and stability of the characteristics, it is preferable that an integer multiple of the grid electrode interval matches that of the repetitive interval and that this integer multiple is equal to or greater than 1 and equal to or smaller than 20. A case where the integer multiple exceeds 20 corresponds to repetitive pitches equal to or smaller than 1 millimeter in a case of, for example, the grid electrode interval of 2 millimeters. In this case, more restrictions are given to a specific manufacturing method, so that the integer multiple exceeding 20 is unfavorable from the viewpoint of a cost reduction although not being particularly inappropriate for the original object of the present embodiment.

Furthermore, typical examples of the shape having the repeatability include a shape formed along lattice intersections particularly in the case of the intermittent shape. Typically, the heavily doped n-type diffusion layer is arranged to correspond to intersections of a square lattice or a hexagonal lattice.

Figures 1, 2, 3, 4, 5, 6, 7, 8, 9, 10:
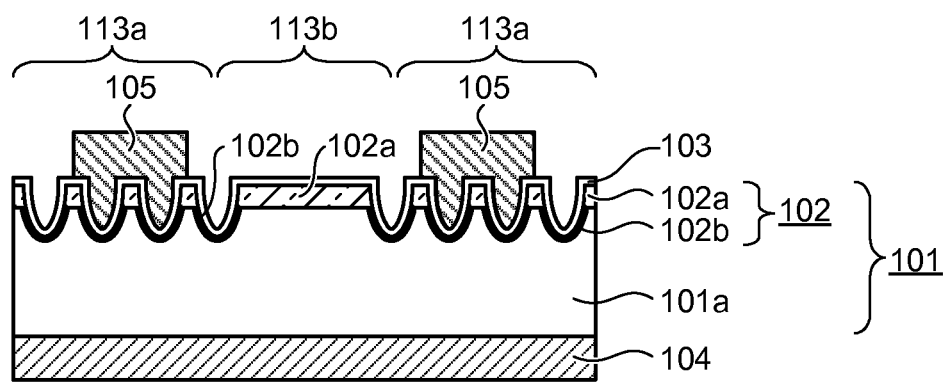
Figures 1, 2:
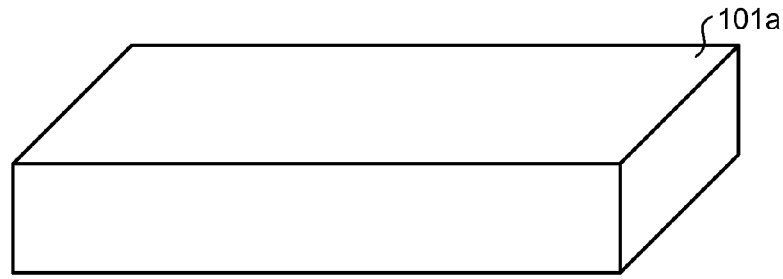
Figure 2:
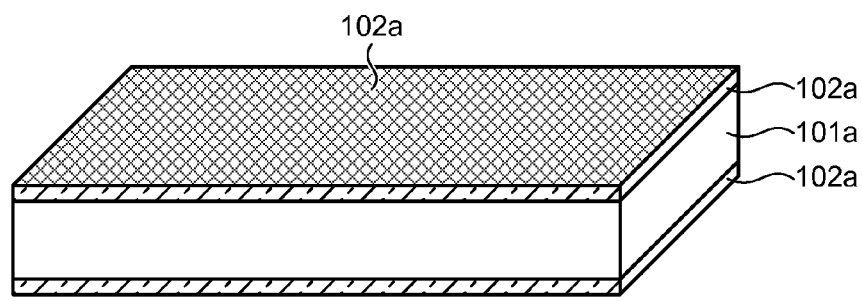
Figures 2, 3:
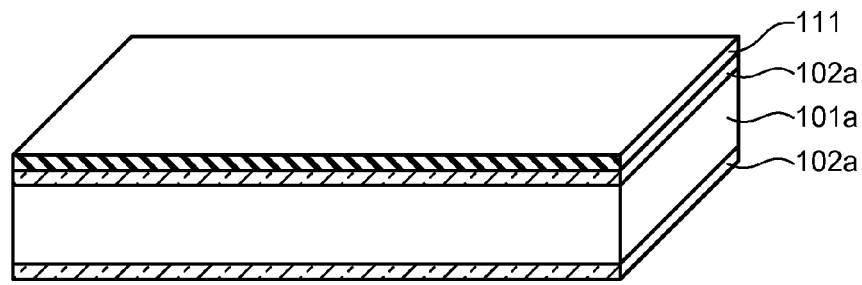
Figures 2, 3, 4:
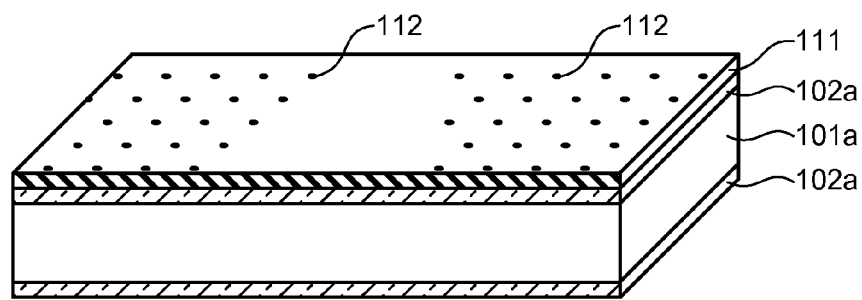
Figures 2, 3, 4, 5:
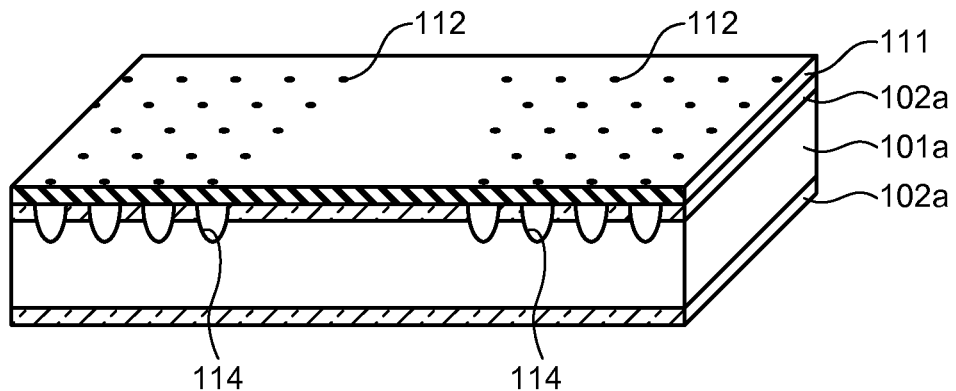
Figures 2, 3, 4, 5, 6:
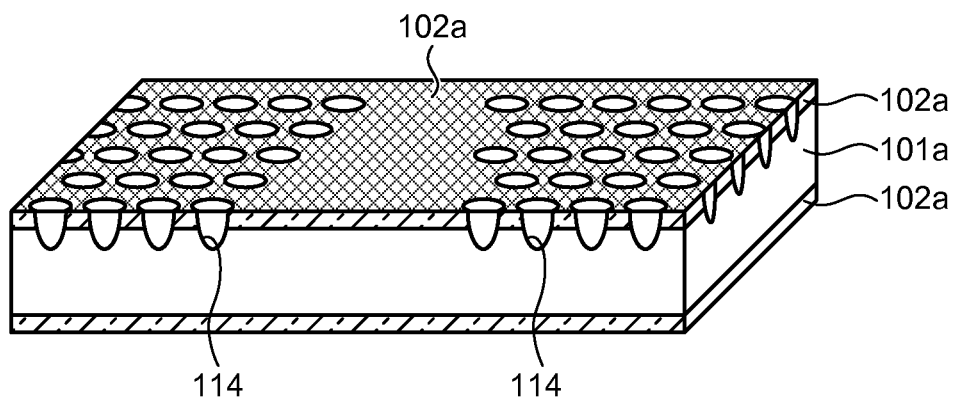
Figures 2, 3, 4, 5, 6, 7:
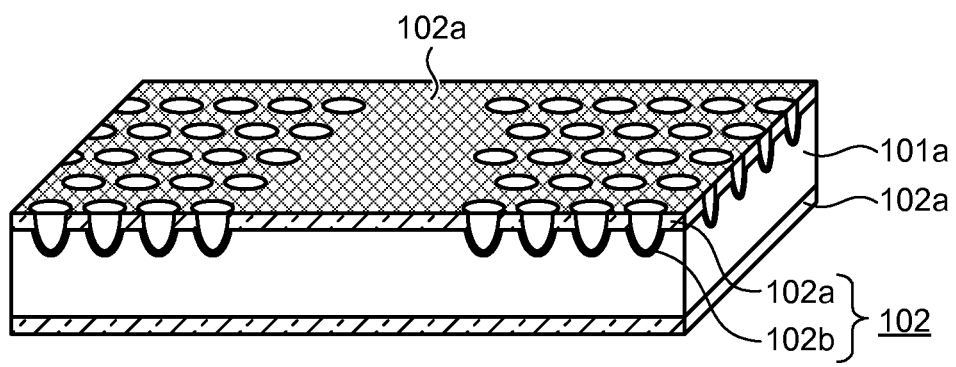
Figures 2, 3, 4, 5, 6, 7, 8:
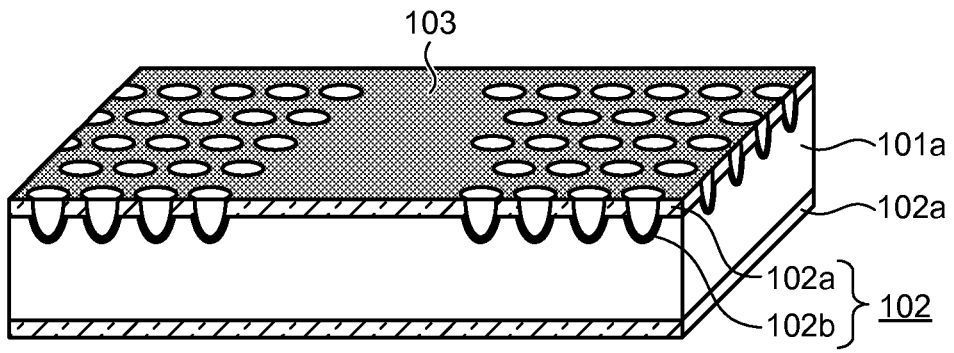
Figures 2, 3, 4, 5, 6, 7, 8, 9:
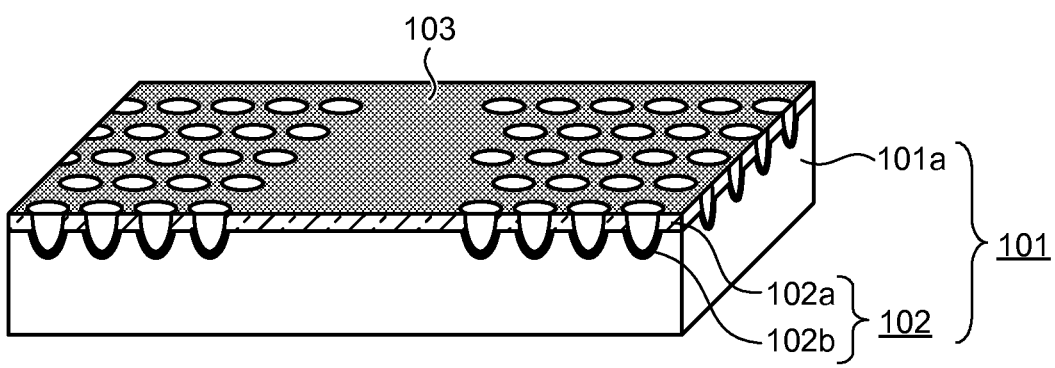
Figures 2, 3, 4, 5, 6, 7, 8, 9, 10:
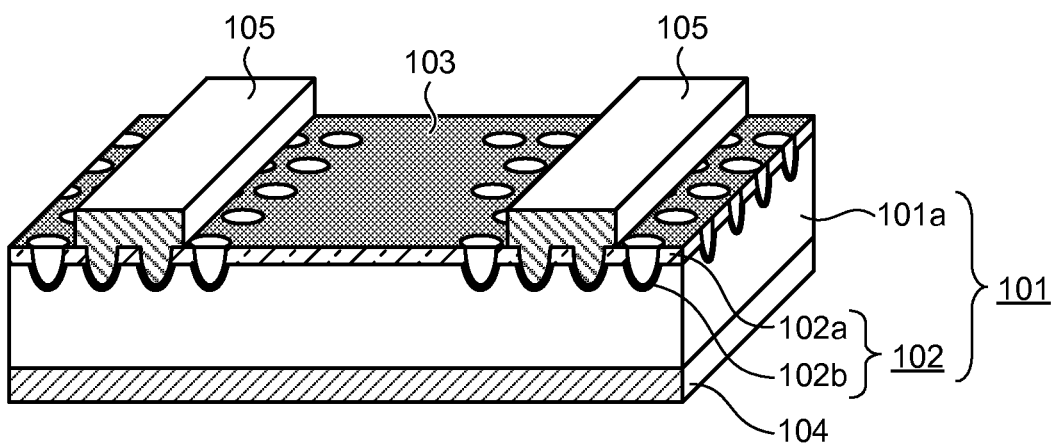
Figure 3:
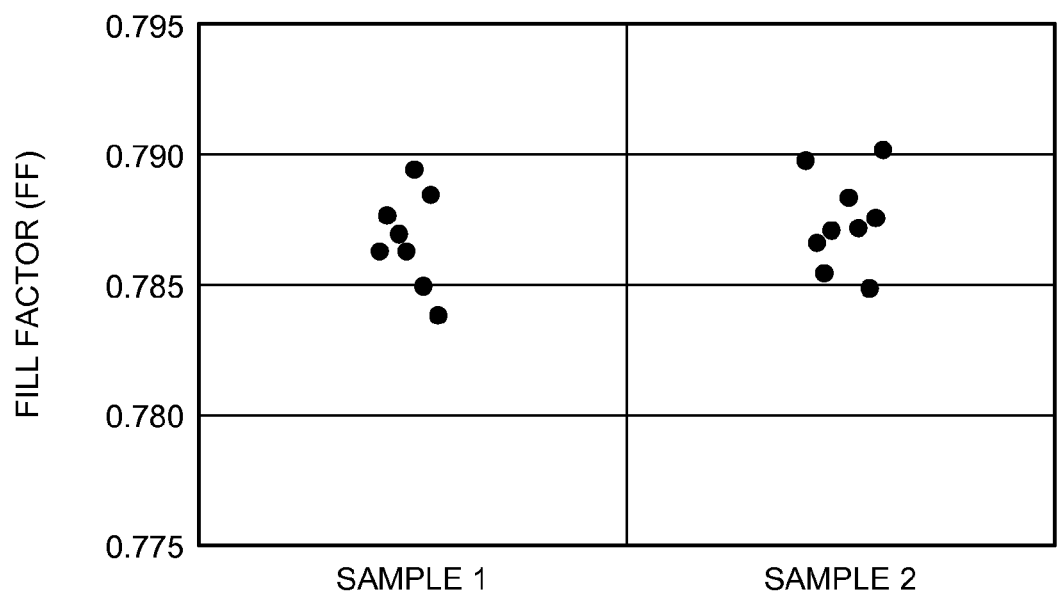
Figure 4:
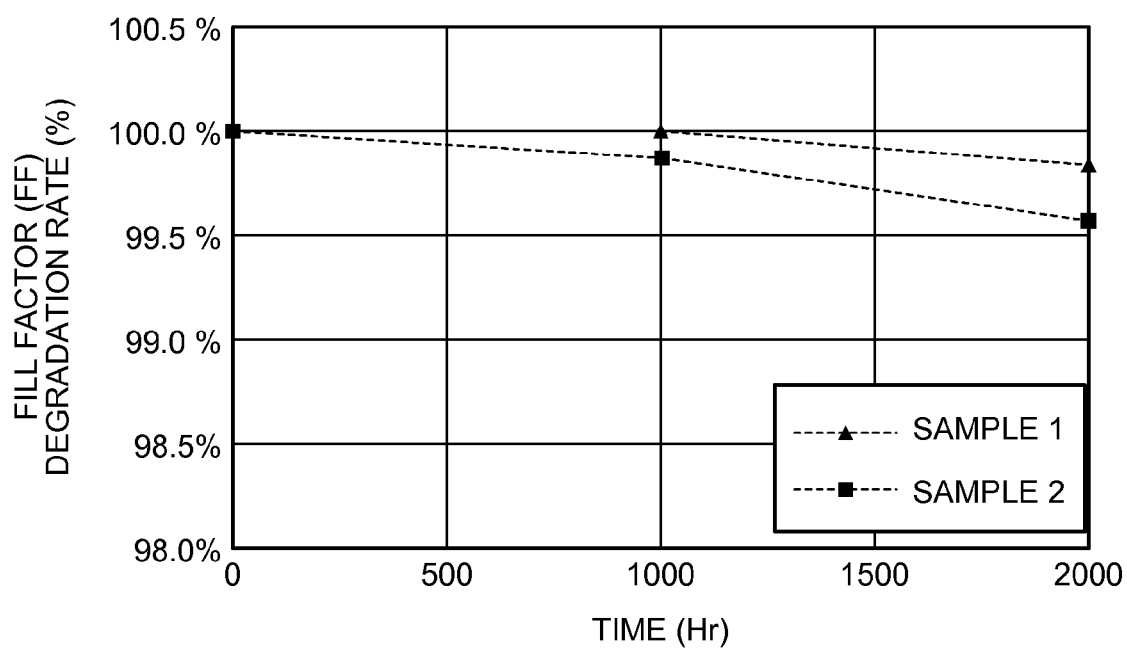
Figure 6:
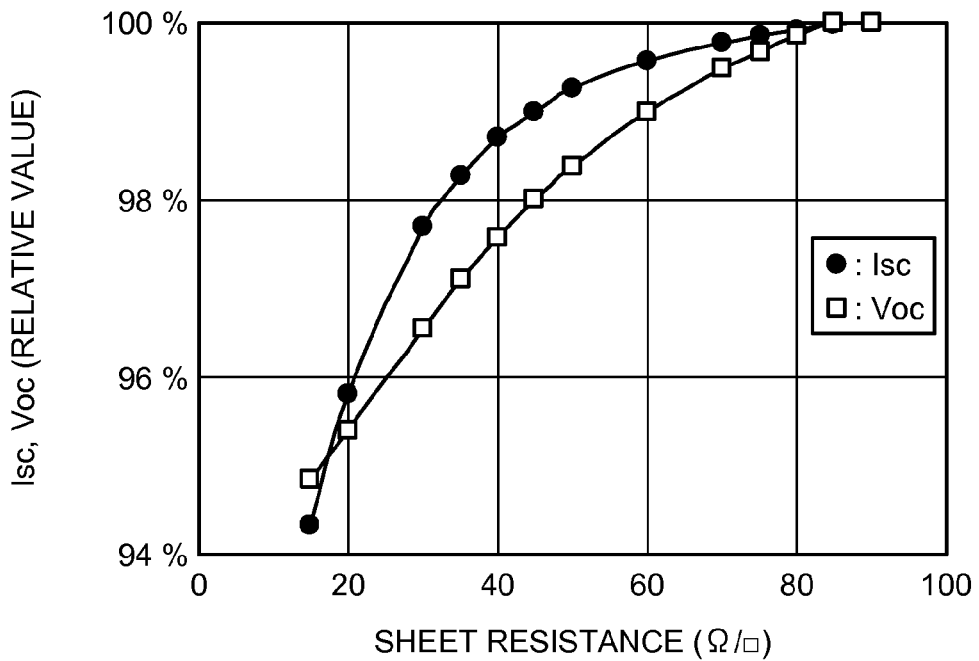
Figure 7:
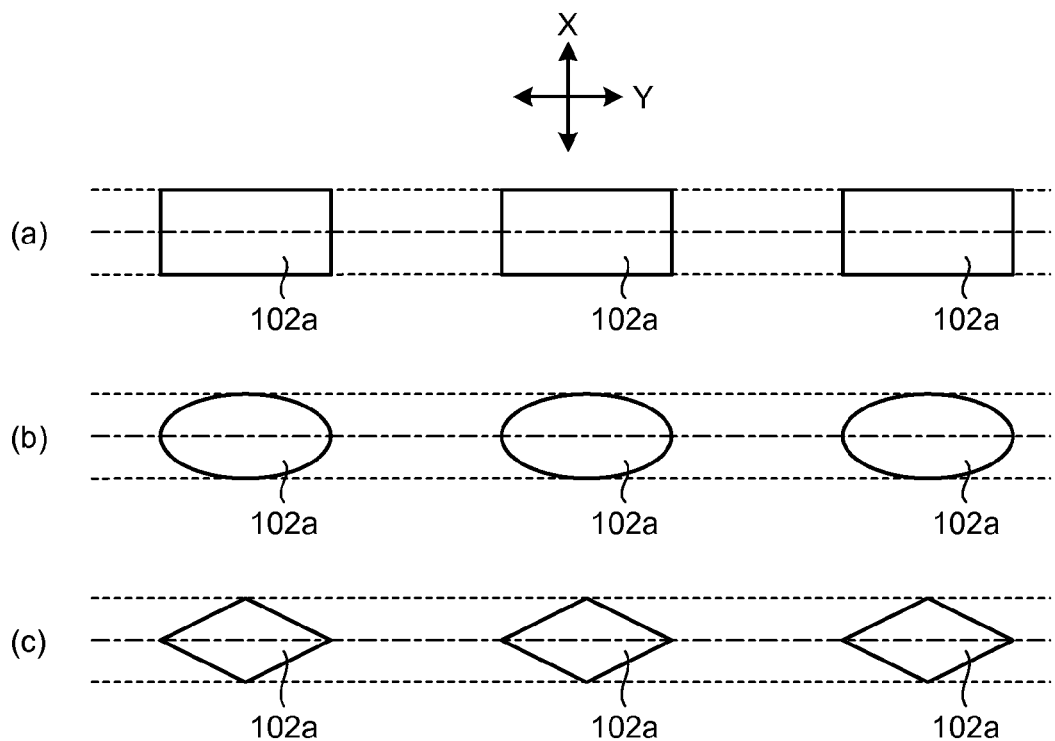
Figures 8, 9:
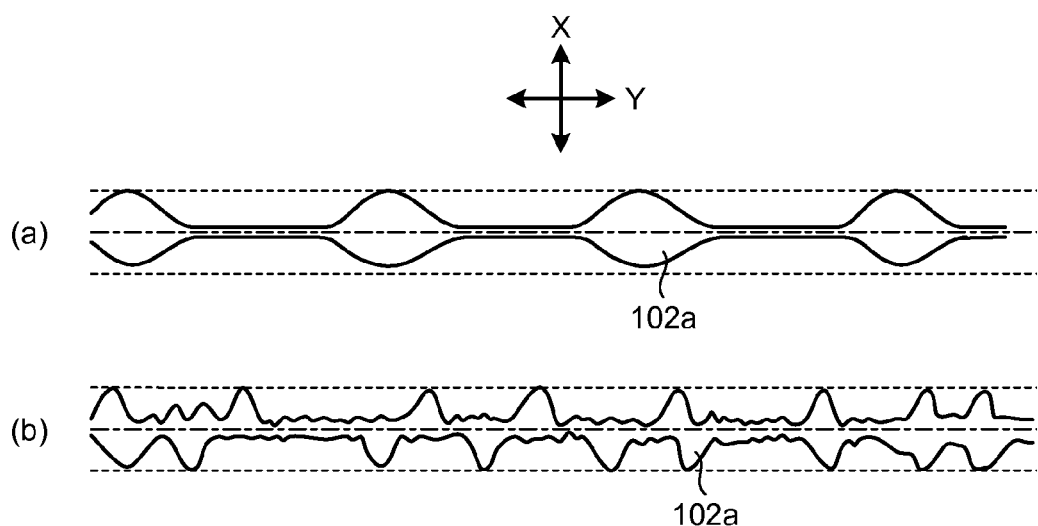

FIG. 10 depict transitions of a voltage and a current with respect to an area ratio of a heavily doped n-type diffusion layer to an entire n-type diffusion layer in a case where "the sheet resistance of the heavily doped n-type diffusion layer is 20Ω/□ and that of the lightly doped n-type diffusion layer is 90Ω/□" in the simulations shown in FIG. 6. FIG. 10(a) depicts a transition of a voltage in a simulation. FIG. 10(b) depicts a transition of a current in a simulation. In FIGS. 10(a) and 10(b), an area ratio A indicates the area ratio of the heavily doped n-type diffusion layer to the entire n-type diffusion layer. In FIGS. 10(a) and 10(b), an area ratio B indicates a relative area ratio of the heavily doped n-type diffusion layer of each target shape according to the present embodiment based on the case where the area ratio A to the entire cells of the "band-shaped heavily doped n-type diffusion layer" serving as the comparison target mentioned above (the entire n-type diffusion layer) is 20% (with this case set to 100%). In FIGS. 10(a) and 10(b), the voltage and the current are calculated while assuming that calculated values of the voltage and the current in a case where the entire n-type diffusion layer is 90Ω/□ are 100%.

As obvious from FIG. 10, as long as the area ratio A of the heavily doped n-type diffusion layer can be suppressed to be equal to or lower than 10%, decreasing rates of the voltage and the current can be kept within 0.5%. Particularly in the case of the voltage, unlike the current the decreasing rate of which can be sufficiently suppressed by an electrode area or the like, it is difficult to suppress the decreasing rate of the voltage by the other elements and even a difference smaller than 1% in a relative ratio is not negligible for the improvement in efficiency.

As described with reference to FIG. 5, the area ratio r of the conventional typical heavily doped n-type diffusion layer is 20%, and it is possible to suppress the adverse effect of the heavily doped n-type diffusion layer on the current when the area ratio r of the heavily doped n-type diffusion layer 102a falls below 20%, that is, the decrease in the current to be lower than the intended current and possible to improve the characteristics. By setting the area ratio r of the heavily doped n-type diffusion layer to be equal to or lower than 10% that is a half of 20%, the effect of improving the characteristics is conspicuous.

Explanations have been given while attention is paid mainly to the lowness of the resistance for introducing the generated current to the grid electrodes. Therefore, the characteristics of the photovoltaic device are mainly and advantageously effective for the fill factor (FF). On the other hand, a structure of increasing the grid interval can be adopted while regarding the lowness of the resistance as likelihood. In this case, a light-receiving area increases, so that the characteristics of the photovoltaic device are mainly and advantageously effective for the short-circuit current (Isc). Needless to mention, fundamental characteristics are equivalent to those described above.

As described above, according to the present embodiment, the patterns (shape and size) of the heavily doped n-type diffusion layer 102a and the lightly doped n-type diffusion layer 102b formed on the light-receiving surface side of the semiconductor substrate 101 in the photovoltaic device are formed as independent patterns (shape and size) without depending on and correlating to the pattern (shape and size) of the light-receiving-surface side electrodes 105 that are also formed on the light-receiving surface side. This can facilitate controlling the patterns of the heavily doped n-type diffusion layer 102a and the lightly doped n-type diffusion layer 102b and makes it possible to manufacture the photovoltaic device at a low cost and at a high yield. Furthermore, the area ratio of the heavily doped n-type diffusion layer 102a can be suppressed to be lower than the area ratio in the case of making the pattern (shape and size) of the heavily doped n-type diffusion layer 102a dependent on that of the light-receiving-surface side electrodes 105 as the practical aspect. Besides, by giving the higher priority to the component of the heavily doped n-type diffusion layer 102a perpendicular to the longitudinal direction of the grid electrodes (regarding the component perpendicular to the longitudinal direction of the grid electrodes as the longitudinal component of the heavily doped n-type diffusion layer 102a), the generated current can be effectively introduced to the grid electrodes with the low area ratio. Moreover, by setting the area ratio of the heavily doped n-type diffusion layer 102a to be equal to or lower than 50% of that of the heavily doped n-type diffusion layer 102a in the uniform-width linear pattern, the generated current can be effectively introduced to the grid electrodes with the low area ratio. According to the present embodiment, these effects make it possible to achieve the photovoltaic device having the high photoelectric conversion efficiency.

While the case of using the p-type silicon substrate as the semiconductor substrate has been described above, similar effects to those described above can be obtained even for a photovoltaic device in which a p-type diffusion layer is formed using an n-type silicon substrate and which is opposite in the conduction type to the photovoltaic device described above. While the case of using the polycrystalline silicon as the semiconductor substrate has been described above, it is needless to mention that similar effects can be obtained even by using a monocrystalline silicon substrate. Furthermore, while it has been described in the present embodiment that the substrate thickness is 200 micrometers, a substrate made thinner down to, for example, about 50 micrometers can be similarly used as long as self-holding of the substrate can be ensured. Moreover, while it has been described above that the substrate size is 150 mm×150 mm, it is needless to mention that similar effects can be obtained whether the substrate size is larger or smaller than 150 mm×150 mm.

Furthermore, a photovoltaic module having a high light confinement effect, excellent reliability, and excellent photoelectric conversion efficiency can be realized by arranging a plurality of photovoltaic devices configured as described in the present embodiment and electrically connecting the adjacent photovoltaic devices either in series or in parallel. In this case, it suffices to electrically connect the light-receiving-surface side electrodes of one of the adjacent photovoltaic devices to the back-surface side electrode of the other photovoltaic device. Furthermore, a laminate process for covering and laminating these photovoltaic devices with an insulating layer is performed. As a result, the photovoltaic module constituted by a plurality of photovoltaic devices is manufactured.

INDUSTRIAL APPLICABILITY

As described above, the photovoltaic device according to the present invention is useful for realizing a photovoltaic device that is excellent in its photoelectric conversion efficiency and reliability and that is inexpensive.

REFERENCE SIGNS LIST 101 semiconductor substrate
101a p-type silicon substrate
102 n-type impurity diffusion layer (n-type diffusion layer)
102a heavily doped n-type impurity diffusion layer (heavily doped n-type diffusion layer)
102b lightly doped n-type impurity diffusion layer (lightly doped n-type diffusion layer)
103 anti-reflection film
104 back-surface side electrode
105 light-receiving-surface side electrode
111 etching resistance film
112 opening
113a texture-structure forming region
113b region where heavily doped n-type diffusion layer remains
114 concave portion
r area ratio of heavily doped n-type diffusion layer to entire n-type diffusion layer
$R_1$ sheet resistance value of heavily doped n-type diffusion layer
$R_2$ sheet resistance value of lightly doped n-type diffusion layer
$R_{total}$ total sheet resistance value of n-type diffusion layer

The invention claimed is:

1. A photovoltaic device comprising:
a silicon substrate of a first conduction type that includes an impurity diffusion layer on one surface side, the impurity diffusion layer having an impurity element of a second conduction type diffused therein;
a light-receiving-surface side electrode that includes a plurality of grid electrodes electrically connected to the impurity diffusion layer and arranged parallel at a certain interval on the one surface side of the silicon substrate; and
a back-surface side electrode formed on the other surface side of the silicon substrate,
wherein the impurity diffusion layer includes a first impurity diffusion layer containing the impurity element at a first concentration and a second impurity diffusion layer containing the impurity element at a second concentration lower than the first concentration wherein the grid electrodes are formed on the second impurity diffusion layer, and
wherein the first impurity diffusion layer is formed so that a direction perpendicular to a longitudinal direction of the grid electrodes in the light-receiving-surface side electrode on the one surface side of the silicon substrate is a longitudinal direction thereof, and so that an area ratio of the first impurity diffusion layer to a band region arranged in the intervals between the grid electrodes is equal to or lower than 50%, a width of the band region being uniform and identical to a maximum width of the first impurity diffusion layer in a direction parallel to the longitudinal direction of the grid electrodes, a length of the band region in a longitudinal direction being identical to a length of the first impurity diffusion layer in the longitudinal direction of the first impurity diffusion layer.

2. The photovoltaic device according to claim 1, wherein the first impurity diffusion layer has an intermittent pattern in the longitudinal direction.

3. The photovoltaic device according to claim 2, wherein a ratio of a long-side length to a short-side length of each first impurity diffusion layer in the intermittent pattern is in a range equal to or larger than 1 and equal to or smaller than 5.

4. The photovoltaic device according to claim 3, wherein the longitudinal direction of each first impurity diffusion layer in the intermittent pattern intersects the longitudinal direction of the grid electrodes at an angle close to a right angle in a plane direction of the silicon substrate, and an absolute value of a tangent (tan θ) of an error angle θ between a direction truly perpendicular to the longitudinal direction of the grid electrodes and the longitudinal direction of the each first impurity diffusion layer is equal to or smaller than a ratio of the short-side length to the long-side length of the each first impurity diffusion layer.

5. The photovoltaic device according to claim 1, wherein the first impurity diffusion layer is formed continuously in the longitudinal direction of the first impurity diffusion layer in a plane direction of the silicon substrate, and the longitudinal direction of the first impurity diffusion layer intersects the longitudinal direction of the grid electrodes at an angle close to a right angle, and an absolute value of a tangent (tan θ) of an error angle θ between a direction truly perpendicular to the longitudinal direction of the grid electrodes and the longitudinal direction of the first impurity diffusion layer is equal to or smaller than a ratio of a maximum width of the first impurity diffusion layer in the longitudinal direction of the grid electrode to a half of an interval between the grid electrodes.

6. The photovoltaic device according to claim 1, wherein when it is defined that a sheet resistance value of the first impurity diffusion layer is $R_1$, a sheet resistance value of the second impurity diffusion layer is $R_2$, and an area ratio of the first impurity diffusion layer to an entire surface of the impurity diffusion layer is r, the first impurity diffusion layer and the second impurity diffusion layer satisfy the following equation (1)

$$\frac{R_1(R_2-70)}{70(R_2-R_1)} \le r \le \frac{R_1(R_2-50)}{50(R_2-R_1)}. \quad (1)$$

7. The photovoltaic device according to claim 6, wherein when it is defined that a sheet resistance value of the first impurity diffusion layer is $R_1$, a sheet resistance value of the second impurity diffusion layer is $R_2$, and an area ratio of the first impurity diffusion layer to an entire surface of the impurity diffusion layer is r, the first impurity diffusion layer and the second impurity diffusion layer satisfy the following equation (2)

$$\frac{R_1(R_2-65)}{65(R_2-R_1)} \le r \le \frac{R_1(R_2-55)}{55(R_2-R_1)}. \quad (2)$$

8. The photovoltaic device according to claim 6, wherein the area ratio of the first impurity diffusion layer to the entire surface of the impurity diffusion layer is equal to or lower than 20%.

9. A manufacturing method of a photovoltaic device comprising:

a first step of diffusing an impurity element of a second conduction type on one surface side of a silicon substrate of a first conduction type to form an impurity diffusion layer on the one surface side of the silicon substrate;

a second step of forming a light-receiving-surface side electrode on the one surface side of the silicon substrate, the light-receiving-surface side electrode including a plurality of grid electrodes electrically connected to the impurity diffusion layer and arranged parallel at a certain interval on the one surface side of the silicon substrate; and a third step of forming a back-surface side electrode electrically connected to the other surface side of the silicon substrate, wherein the first step includes:
  a step of forming a first impurity diffusion layer containing the impurity element at a first concentration; and
  a step of forming a second impurity diffusion layer containing the impurity element at a second concentration lower than the first concentration wherein the grid electrodes are formed on the second impurity diffusion layer, and wherein the first impurity diffusion layer is formed so that a direction perpendicular to a longitudinal direction of the grid electrodes in the light-receiving-surface side electrode on the one surface side of the silicon substrate is a longitudinal direction thereof, and so that an area ratio of the first impurity diffusion layer to a band region arranged in the intervals between the grid electrodes is equal to or lower than 50%, a width of the band region being uniform and identical to a maximum width of the first impurity diffusion layer in a direction parallel to the longitudinal direction of the grid electrodes, a length of the band region in a longitudinal direction being identical to a length of the first impurity diffusion layer in the longitudinal direction of the first impurity diffusion layer.

10. The manufacturing method of a photovoltaic device according to claim 9, wherein at the first step, the first impurity diffusion layer and the second impurity diffusion layer are formed to satisfy the following equation (3) when it is defined that a sheet resistance value of the first impurity diffusion layer is $R_1$, a sheet resistance value of the second impurity diffusion layer is $R_2$, and an area ratio of the first impurity diffusion layer to an entire surface of the impurity diffusion layer is r $$\frac{R_1(R_2-70)}{70(R_2-R_1)} \le r \le \frac{R_1(R_2-50)}{50(R_2-R_1)}. \quad (3)$$

11. The manufacturing method of a photovoltaic device according to claim 10, wherein at the first step, the first impurity diffusion layer and the second impurity diffusion layer are formed to satisfy the following equation (4) when it is defined that a sheet resistance value of the first impurity diffusion layer is $R_1$, a sheet resistance value of the second impurity diffusion layer is $R_2$, and an area ratio of the first impurity diffusion layer to an entire surface of the impurity diffusion layer is r $$\frac{R_1(R_2-65)}{64(R_2-R_1)} \le r \le \frac{R_1(R_2-55)}{55(R_2-R_1)}. \qquad (4)$$

12. The manufacturing method of a photovoltaic device according to claim 10, wherein the area ratio of the first impurity diffusion layer to the entire surface of the impurity diffusion layer is equal to or lower than 20%.

13. A photovoltaic module comprising at least two photovoltaic devices that are electrically connected to in series or in parallel, wherein each photovoltaic device includes:
- a silicon substrate of a first conduction type that includes an impurity diffusion layer on one surface side, the impurity diffusion layer having an impurity element of a second conduction type diffused therein;
- a light-receiving-surface side electrode that includes a plurality of grid electrodes electrically connected to the impurity diffusion layer and arranged parallel at a certain interval on the one surface side of the silicon substrate; and
- a back-surface side electrode formed on the other surface side of the silicon substrate,
- wherein the impurity diffusion layer includes a first impurity diffusion layer containing the impurity element at a first concentration and a second impurity diffusion layer containing the impurity element at a second concentration lower than the first concentration wherein the plurality of grid electrodes are formed on the second impurity diffusion layer, and
- wherein the first impurity diffusion layer is formed so that a direction perpendicular to a longitudinal direction of the grid electrodes in the light-receiving-surface side electrode on the one surface side of the silicon substrate is a longitudinal direction thereof, and so that an area ratio of the first impurity diffusion layer to a band region arranged in the intervals between the grid electrodes is equal to or lower than 50%, a width of the band region being uniform and identical to a maximum width of the first impurity diffusion layer in a direction parallel to the longitudinal direction of the grid electrodes, a length of the band region in a longitudinal direction being identical to a length of the first impurity diffusion layer in the longitudinal direction of the first impurity diffusion layer.

\* \* \* \* \*